United States Patent
Stillabower

(10) Patent No.: US 6,986,454 B2
(45) Date of Patent: Jan. 17, 2006

(54) ELECTRONIC PACKAGE HAVING CONTROLLED HEIGHT STAND-OFF SOLDER JOINT

(75) Inventor: Morris D Stillabower, Tipton, IN (US)

(73) Assignee: Delphi Technologies, Inc., Troy, MI (US)

( * ) Notice: Subject to any disclaimer, the term of this patent is extended or adjusted under 35 U.S.C. 154(b) by 83 days.

(21) Appl. No.: 10/616,617

(22) Filed: Jul. 10, 2003

(65) Prior Publication Data

US 2005/0006442 A1    Jan. 13, 2005

(51) Int. Cl.
    *B23K 31/00* (2006.01)
    *B23K 31/02* (2006.01)
    *B23K 35/12* (2006.01)

(52) U.S. Cl. ............ 228/180.22; 228/246; 228/248.1; 228/248.5; 257/795; 438/25; 438/106

(58) Field of Classification Search .............. 228/109, 228/123.1, 178–180.22, 225, 226, 245–255; 438/25, 51, 55, 64, 106–127; 257/618, 789, 257/795, E27.001

See application file for complete search history.

(56) References Cited

U.S. PATENT DOCUMENTS

| | | | |
|---|---|---|---|
| 4,641,222 A | 2/1987 | Derfiny et al. | 361/403 |
| 4,731,130 A | 3/1988 | O'Leary | |
| 5,315,070 A | 5/1994 | Maiwald | 174/250 |
| 5,328,521 A | 7/1994 | Keusseyan | 148/24 |
| 5,926,731 A | 7/1999 | Coapman et al. | |
| 5,931,371 A | 8/1999 | Pao et al. | 228/180 |
| 6,340,113 B1 * | 1/2002 | Avery et al. | 228/248.5 |
| 6,631,078 B2 * | 10/2003 | Alcoe et al. | 361/719 |

FOREIGN PATENT DOCUMENTS

| | | |
|---|---|---|
| JP | 06-054503 | 2/1994 |
| JP | 07-045926 | 2/1995 |
| JP | 07-131586 | 5/1995 |
| JP | 11-026910 | 1/1999 |

* cited by examiner

*Primary Examiner*—Colleen P. Cooke
(74) *Attorney, Agent, or Firm*—Stefan V. Chmielewski

(57) ABSTRACT

An electronic package (10) is provided which includes a circuit board (12) having a substrate (14) and circuitry (16) and a surface mount device (22) having a contact terminal (24). A mounting pad (28) is formed on the circuit board (12). The electronic package (10) also includes a solder joint (30) connecting the contact terminal (24) of the surface mount device (22) to the mounting pad (28) on the circuit board (12). The solder joint (30) includes a reflowable solder and a plurality of stand-off members (32 or 42). The stand-off members (32 or 42) provide a separation distance (H) between the circuit board (12) and surface mount device (22) in the range of about 0.01 mm to 0.10 mm.

18 Claims, 1 Drawing Sheet

US 6,986,454 B2

ELECTRONIC PACKAGE HAVING CONTROLLED HEIGHT STAND-OFF SOLDER JOINT

TECHNICAL FIELD

The present invention generally relates to circuit board packages, and more particularly relates to the solder joint interconnection of a surface mount electronic device to a circuit board.

BACKGROUND OF THE INVENTION

Electronic packages commonly employ a plurality of surface mount electronic devices such as diodes, inductors, capacitors, resistors, varistors, etc., assembled onto a printed circuit board. The printed circuit board generally includes a dielectric substrate (e.g. organic resin reinforced by fibers) and multiple layers of electrically conductive circuit traces. Many circuit boards include perforations (holes) for matingly receiving lead lines on lead type surface mount electronic devices that form an electrical connection to the circuit traces.

Lead-less surface mount devices have also been mounted onto printed circuit boards by using surface formed solder joints. However, conventional lead-less surface mount devices have been known to suffer from thermal fatigue in the solder joint, particularly when large surface mount devices are mounted on an organic circuit board and utilized in an environment with high temperature (e.g., +100° C.) and/or wide temperature variations (e.g., −40° C. to +150° C.). The solder joint fatigue is at least partially caused by large differences in the differential coefficients of thermal expansion (CTE) that exist between the circuit board and the surface mount device materials. These differences in thermal expansion can result in catastrophic cracking of brittle components such as surface mount capacitors. Generally, larger components have higher stress and, thus, shorter component life. However, large components are generally desirable because fewer components are required.

Surface mount devices typically have much smaller coefficients of expansion as compared to organic based substrates employed in the circuit board. Temperature fluctuations of the electronic package with continuous power cycles generally produce accumulative fatigue in the solder joints. This accumulative thermal fatigue produces intergranular precipitation and alloy separation in the solder joints which accelerates component breakage. The solder joint fatigue may be accelerated by the presence of vibrations. Additionally, the surface mount devices are typically pulled down tightly to the mounting pads by the action of gravity, soldering, and capillary attraction, thereby resulting in very low collumar compliance. This may result in catastrophic electrical failure of the package due to breakage of the solder joint and/or surface mount device.

Several approaches have been proposed to elevate the surface mount device from the circuit board. According to one approach, mechanical spacers are disposed between the surface mount device and the circuit board and separate from the solder connections to elevate the surface mount device from the circuit board. According to another approach, high temperature solder stand-off members are disposed in the solder paste such that during reflow, the high temperature solder stand-off members remain solid (rigid), and thus provide a stand-off height to elevate the surface mount device from the circuit board. While some approaches elevate the surface mount device from the circuit board, many approaches typically elevate the surface mount device by more than 0.25 mm which may leave the device and solder joint susceptible to damage caused by vibration, particularly at the harmonic frequency of the resultant structure. Extensive elevation of the surface mount device from the circuit board may lead to excessive movement of the device relative to the circuit board and, hence, may weaken the solder joint and lead to breakage of the interconnecting solder joint.

Accordingly, it is therefore desirable to provide for an electronic package having a surface mount device to circuit board interconnection which is less susceptible to thermal fatigue. In particular, it is desirable to provide for such an electronic package that allows for the use of one or more large surface mount devices on a circuit board, that is less susceptible to adverse effects (e.g., breakage) caused by variations in the thermal coefficients of expansion of the materials. It is further desirable to optimize the elevation of the surface mount device from the circuit board to minimize vibration induced fatigue of the solder joint.

SUMMARY OF THE INVENTION

According to the present invention, an electronic package is provided that includes a circuit board having a substrate and circuitry and a surface mount device having a contact terminal. A mounting pad is formed on the circuit board. The electronic package also includes a solder joint connecting the contact terminal of the surface mount device to the mounting pad on the circuit board. The solder joint includes a reflow solder material and a plurality of stand-off members. The plurality of stand-off members provide a separation distance between the circuit board and surface mount device in the range of about 0.01 mm to 0.10 mm. Accordingly, the plurality of stand-off members provide a controlled height solder joint interconnection between a surface mount device and a circuit board so as to minimize shear fatigue which may be caused by thermal expansion and vibrations.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
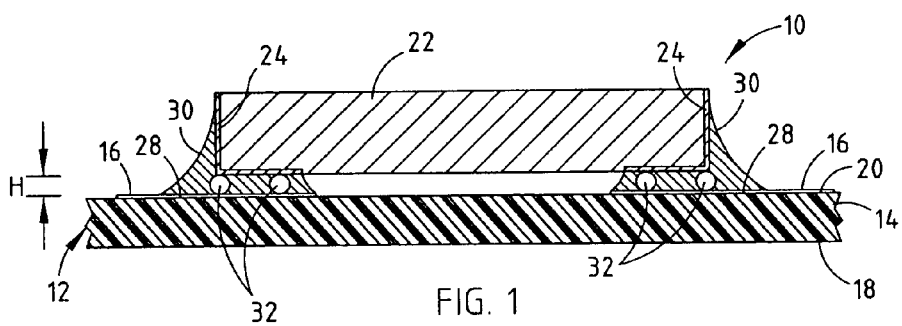
FIG. 1 is a cross-sectional view taken through an electronic package employing stand-off members in a solder joint according to a first embodiment of the present invention.

Referring to FIG. 1, an electronic package 10 is generally illustrated having a surface mount electronic device 22 mounted onto the surface of a circuit board 12. While only a portion of the electronic package 10 is shown and described herein, it should be appreciated that the electronic package 10 may include any number of one or more surface mount devices 22 mounted onto circuit board 12 and connected to circuit board 12 by way of a controlled height solder joint interconnection according to the present invention.

The circuit board 12 may include a printed circuit board having a dielectric substrate 14 and electrically conductive circuitry 16 (e.g., printed circuit traces). The circuit board 12 is shown according to one embodiment, having an upper surface 20 and a lower surface 18, both of which may include electrical circuitry 16 fabricated thereon. However, it should be appreciated that the circuit board 12 may be formed as a laminated circuit board having electrical circuitry 16 located on any of the upper and lower surfaces 20 and 18 and intermediate layers of the dielectric substrate 14. The dielectric substrate 14 of printed circuit board 12 may include an organic-based material, such as organic resin reinforced by fibers, according to one embodiment. According to another embodiment, the circuit board 12 may include inorganic material as the dielectric substrate 14. Examples of circuit board materials may include fire retardant resin, such as FR4, alumina, metal plated plastic, flex on aluminum, porcelainized steel, and other suitable circuit board materials.

Formed on the upper surface 20 of circuit board 12 are electrically conductive mounting pads 28 which serve to mechanically and electrically connect the surface mount electronic device 22 to circuit board 12. The circuit board 12 may be connected to electrical circuitry 16 to provide an electrical circuit path. The circuit board 12 may include a solder resist layer (not shown) printed on the upper surface of each of mounting pads 28 to define a solder window boundary that contains the volume of reflowed solder. During a solder reflow process, the solder paste is reshaped on the upper surface of the mounting pad 28.

The surface mount electronic device 22 is shown mechanically connected to printed circuit board 12 and also electrically coupled to printed circuit board 12. The surface mount electronic device 22 may include any of a number of surface mount devices including electronic components such as a diode, an inductor, a capacitor, a resistor, a varister, as well as other devices that are mechanically mountable on the surface of a circuit board. The surface mount electronic device 22 shown is a lead-less device (e.g., component) having contact terminals 24 for providing mechanical support connections and electrical connections to the device 22. The contact terminals 24 may each include a separate layer of conductive material (as shown) or may include a conductive surface of the electronic component (device) 22. Each of the contact terminals 24 are mechanically connected to the circuit board 12 by way of a solder joint 30. The solder joint 30 is electrically conductive and serves to form both a mechanical interconnection and an electrical circuit path between the surface mount electronic device 22 and circuit board 12.

The interconnection formed by the solder joint 30 at each of mounting pads 28 is formed to provide a controlled solder joint height H which elevates the lower surface of surface mount device 22 from the upper surface 20 of printed circuit board 12. To achieve the controlled solder joint height H, the solder joint 30 includes a solder mixture of reflow solder paste and a plurality of stand-off members 32 having a height dimension suitable to provide a stand-off height H in the range of about 0.01 mm to 0.10 mm.

Figure 2:
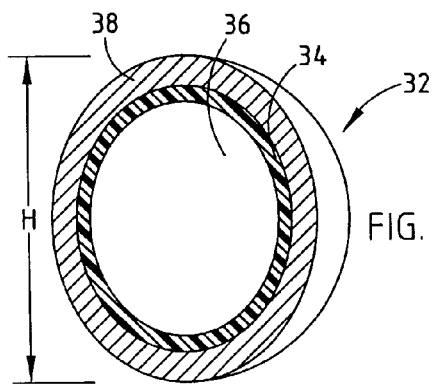
FIG. 2 is an enlarged cross-sectional view taken through one of the stand-off members shown in FIG. 1.

The solder mixture of solder joint 30 includes a plurality of stand-off members 32 substantially uniformly sized and disposed in a low temperature printable solder paste. Each of the stand-off members 32 shown is formed as a substantially spherical stand-off member having a diameter equal to about height H to define the height H of the solder joint 30 and, thus, the separation distance between the surface mount device 22 and circuit board 12. One of the stand-off members 32 is further shown in FIG. 2 in the general shape of a spherical ball having an electrically conductive outer surface 38. The electrically conductive outer surface 38 may include a high temperature solder material that has a reflow temperature greater than the solder paste reflow temperature. The stand-off member 32 shown includes a hollow spherical ball 34 which may be formed as a hollow glass ball, according to one example. According to another example, the spherical ball 34 may be formed of a flexible polymeric material such as plastic, which is deformable to provide energy absorption that may serve to further reduce fatigue of the resultant solder joint 30. The spherical ball 34 shown has a hollow central cavity 36 which may reduce the total volume of solder paste and, hence, may reduce the cost. It should be appreciated that the spherical ball 34 may be configured in spherical or non-spherical shapes with or without the hollow cavity 36, so long as the stand-off member 32 has an affinity for the solder paste.

Figure 3:
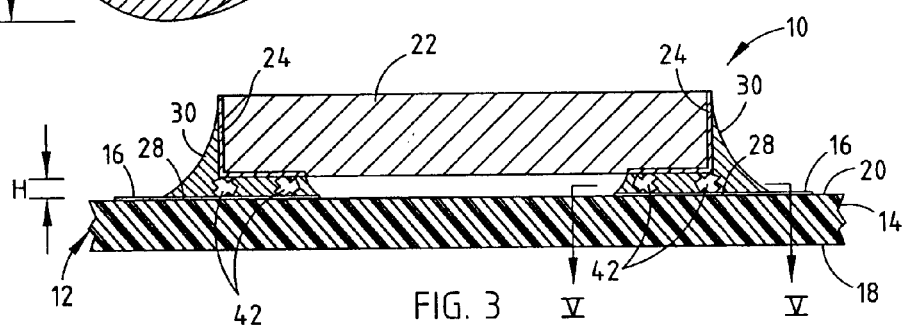
FIG. 3 is a cross-sectional view taken through an electronic package employing stand-off members according to a second embodiment of the present invention.

Referring to FIG. 3, the electronic package 10 is illustrated having a solder paste containing a plurality of irregularly shaped stand-off members 42. Each of the irregularly shaped stand-off members 42 has a non-spherical shape and includes a stand-off dimension that determines the height H of the solder joint 30 and, hence, separation distance between surface mount device 22 and circuit board 12. The irregularly shaped stand-off member 42 may include a high temperature solder aggregate having a reflow temperature greater than the reflow temperature of the low temperature eutectic solder paste of solder joint 32. The plurality of uniformly sized irregularly shaped stand-off members 42 are mixed in a solder mixture with a low temperature solder paste.

The solder mixture is heated to an elevated temperature to allow the solder paste to reflow into contact with contact terminal 24 and mounting pad 28. During the reflow process, the stand-off members 42 that are disposed between contact terminal 24 and mounting pad 28 serve to separate the surface mount device 22 from the circuit board 12 by the stand-off height H. The reflowed solder is then cooled to solidify and form an electrical and mechanical connection between contact terminal 24 and mounting pad 28.

Figure 4:
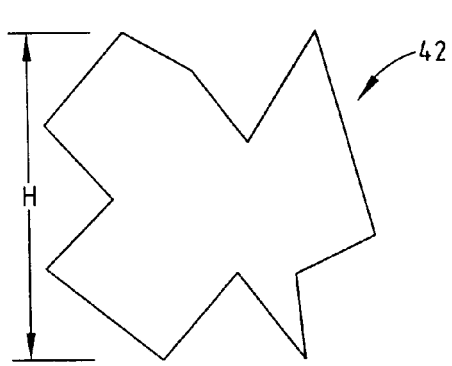
FIG. 4 is a cross-sectional view taken through one of the stand-off members shown in FIG. 3.

Referring to FIG. 4, one of the irregularly shaped stand-off members 42 is further illustrated having a height dimension H. It should be appreciated that the irregularly shaped stand-off member 42 may be configured in any of a variety of shapes, as long as the stand-off member 42 has an affinity for the solder paste and provides a substantially controlled solder joint height H distancing the surface mount device 22 from the circuit board 12.

Figure 5:
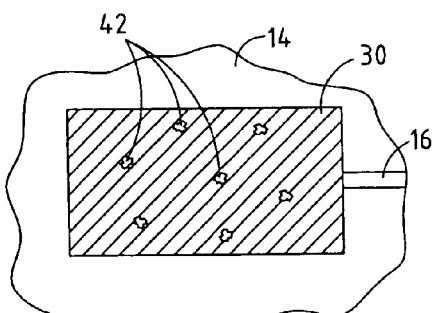
FIG. 5 is a cross-sectional view taken through lines V—V of the solder joint shown in FIG. 3.

The solder joint 30 is further illustrated in FIG. 5 taken through a horizontal cross-section thereof. The solder joint 30 employs a plurality of stand-off members 42 which may be substantially uniformly disposed in the solder joint 30. The number of stand-off members 42 employed in each solder joint 30 should be sufficient to support the surface mount device 22 at the controlled stand-off height H. According to one embodiment, at least three stand-off members 42 are disposed directly between the contact terminal 24 and mounting pad 28 to maintain a level positioning of the surface mount device 22 relative to the upper surface 20 of the circuit board 12 during the reflow process.

The solder joint 30 may be formed of any of a number of known solder materials mixed with a plurality of stand-off members 32 or 42 to form the solder mixture. According to one example, the solder paste may be comprised of indium #106 (Sn63Pb37) eutectic solder paste having a solder reflow temperature of about 183° C. The stand-off members 32 or 42 may comprise aggregate particles employing substantially uniformly sized indium #159 (Pb90Sn10) having a high temperature solder reflow temperature of 302° C. According to the aforementioned example, the solder mixture may be reflowed at a temperature at or above 183° C. and less than 302° C. such that the solder paste transitions to semi-liquid state to reflow, while the stand-off aggregate stand-off particles 32 or 42 remain solid in the solder mixture.

The electronic package 10 according to the present invention advantageously employs a solder joint 30 having a solder reflow and a plurality of stand-off members 32 or 42 that effectively space the surface mount device 22 from the circuit board 12. According to one embodiment, the stand-off members 32 or 42 have a height dimension H in the range of about 0.01 mm to 0.10 mm. According to a more specific embodiment, the height dimension H of the stand-off members 32 or 42 may be within the range of about 0.01 mm–0.03 mm. The plurality of stand-off members 32 or 42 consume a volume in the range of about 0.001 to 5% of the total volume of the solder joint 30. According to a more preferred embodiment, the stand-off members 32 or 42 consume a volume in the range of about 0.001%–1.0% of total volume of the solder joint 30. The stand-off members 32 or 42 may include any of a number of materials, as long as the stand-off members 32 or 42 have an affinity for the solder paste.

Accordingly, the solder joint 30 interconnection achieved with the present invention advantageously provides for an enhanced electrical and mechanical connection which may achieve a reduction in strain energy of the solder joint 30 by providing additional columnar solder height. Additionally, the controlled height solder interconnection allows for a reduction in component count, enhanced efficiency in use of the circuit board 12, simplified assembly and processing, and a reduction in the number of component placement machines that may be required for the electronic package 10.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

What is claimed is:

1. An electronic package comprising:
    a circuit board having a substrate and circuitry;
    a surface mount device having a contact terminal;
    a mounting pad formed on the circuit board; and
    a solder joint connecting the contact terminal of the surface mount device to the mounting pad on the circuit board, the solder joint comprising a reflowable solder and a plurality of stand-off members disposed in the solder,
    wherein the plurality of stand-off members are electrically conductive, have an affinity for solder and provide a substantially fixed separation distance between the circuit board and surface mount device,
    wherein said reflowable solder is formed of monolithic material having a relatively low melting temperature, and
    wherein said stand-off members are composed of an aggregation of a reflowable solder having a relatively high melting temperature and a non-solder material which maintains dimensional integrity at said relatively high melting temperature.

2. The electronic package as defined in claim 1, wherein the plurality of stand-off members consumes in the range of about 0.001 to 5% of total volume of the solder joint.

3. The electronic package as defined in claim 1, wherein the plurality of stand-off members each comprise a hollow member having an outer surface with an affinity for solder.

4. The electronic package as defined in claim 3, wherein the hollow member comprises a conductive outer surface.

5. The electronic package as defined in claim 4, wherein the conductive outer surface comprises a high temperature solder material having a reflow temperature higher than a reflowable temperature of the solder.

6. The electronic package as defined in claim 1, wherein the plurality of stand-off members each comprises an irregularly shaped particle.

7. The electronic package as defined in claim 1, wherein the surface mount device comprises an electronic device having electrical circuitry.

8. The electronic package as defined in claim 1, wherein the plurality of stand-off members comprises at least three stand-off members disposed between the contact terminal and the mounting pad.

9. The electronic package as defined in claim 1, wherein the separation distance is in the range of about 0.01 mm–0.03 mm.

10. A method of forming an electronic package having a controlled height stand-off distance between a surface mount device and a circuit board, said method comprising:
    providing a circuit board having a substrate and circuitry;
    forming a mounting pad on the circuit board;
    providing a surface mount device having a contact terminal;
    preforming a plurality of discrete electrically conductive stand-off members having an affinity for solder as an aggregation of a reflowable solder having a relatively high melting temperature and a non-solder material which maintains dimensional integrity at said relatively high melting temperature;
    forming a mixture of reflowable solder of the type having a relatively low melting temperature and said plurality of stand-off members; and
    forming a solder joint with the mixture to connect the contact terminal of the surface mount device to the mounting pad on the circuit board, wherein the circuit board and surface mount device are separated by a substantially fixed distance.

11. The method as defined in claim 10, wherein the plurality of stand-off members consumes in the range of about 0.001 to 5% of total volume of the solder joint.

12. The method as defined in claim 10, wherein the step of forming the solder joint comprises heating the mixture to an elevated solder temperature and bringing the heated mixture into contact with the contact terminal and the mounting pad.

13. The method as defined in claim 10, further comprising the step of forming each of the plurality of stand-off members as a hollow member having an outer surface with an affinity for solder.

14. The method as defined in claim 10, further comprising the step of forming the plurality of stand-off members into irregularly shaped particles.

15. The method as defined in claim 10, wherein the separation distance H is in the range of about 0.01 mm–0.03 mm.

16. The method as defined in claim 10, wherein the plurality of stand-off members each comprises a dimension in the range of about 0.01 mm to 0.10 mm.

17. The method as defined in claim 10, wherein the circuit board and surface mount device are separated by a distance in the range of about 0.01 mm to 0.10 mm.

18. The electronic package as defined in claim 1, wherein the plurality of stand-off members provide a separation distance between the circuit board and mount device in the range of about 0.01 mm to 0.10 mm.

* * * * *